US012158827B2

(12) United States Patent
Balakrishnan et al.

(10) Patent No.: US 12,158,827 B2
(45) Date of Patent: Dec. 3, 2024

(54) FULL DYNAMIC POST-PACKAGE REPAIR

(71) Applicant: Advanced Micro Devices, Inc., Santa Clara, CA (US)

(72) Inventors: Kedarnath Balakrishnan, Bangalore (IN); Kevin M. Brandl, Austin, TX (US); James R. Magro, Lakeway, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 55 days.

(21) Appl. No.: 18/091,163

(22) Filed: Dec. 29, 2022

(65) Prior Publication Data

US 2024/0220379 A1    Jul. 4, 2024

(51) Int. Cl.
*G06F 11/00* (2006.01)
*G06F 11/14* (2006.01)
*G06F 11/20* (2006.01)

(52) U.S. Cl.
CPC ...... *G06F 11/2094* (2013.01); *G06F 11/1402* (2013.01); *G06F 2201/805* (2013.01)

(58) Field of Classification Search
CPC ............. G06F 11/1402; G06F 11/2904; G06F 2201/805
See application file for complete search history.

(56) References Cited

U.S. PATENT DOCUMENTS

| | | | |
|---|---|---|---|
| 8,255,772 B1 | 8/2012 | Foley | |
| 11,436,112 B1 * | 9/2022 | Kumar | G06F 11/2046 |
| 11,704,211 B1 * | 7/2023 | Kaplan | G06F 11/1666 |
| | | | 714/6.13 |
| 2003/0097608 A1 | 5/2003 | Rodeheffer | |
| 2003/0154437 A1 | 8/2003 | Chih | |
| 2007/0089032 A1 | 4/2007 | Alexander et al. | |
| 2008/0195888 A1 | 8/2008 | Shuma | |
| 2012/0317352 A1 | 12/2012 | Kang et al. | |
| 2015/0278053 A1 * | 10/2015 | Vahidsafa | G06F 12/0646 |
| | | | 714/6.3 |
| 2017/0185499 A1 * | 6/2017 | Lee | G11C 7/12 |
| 2017/0344421 A1 | 11/2017 | Brandl | |
| 2020/0151070 A1 * | 5/2020 | Lee | G06F 12/10 |

(Continued)

OTHER PUBLICATIONS

JEDEC Standard; "DDR5 SDRAM"; white paper; JESD79-5; JEDEC Solid State Technology Association; 3103 North 10th Street, Suite 240 South, Arlington, VA 22201; United States; Jul. 2020; 17 pages.

(Continued)

*Primary Examiner* — Joshua P Lottich
(74) *Attorney, Agent, or Firm* — Polansky & Associates, P.L.L.C.; Paul J. Polansky

(57) ABSTRACT

A memory controller includes a command queue, an arbiter, and a controller. The controller is responsive to a repair signal for migrating data from a failing region of a memory to a buffer, generating at least one command to perform a post-package repair operation of the failing region, and migrating the data from the buffer to a substitute region of the memory. The controller migrates the data to and from the buffer by providing migration read requests and migration write requests, respectively, to the command queue. The arbiter uses the plurality of arbitration rules for both the read migration requests and the write migration requests, and the read access requests and the write access requests.

20 Claims, 5 Drawing Sheets

(56) References Cited

U.S. PATENT DOCUMENTS

2021/0191829 A1* 6/2021 Muthiyalu .......... G11C 29/814
2022/0012147 A1* 1/2022 Ki ...................... G06F 11/0793

OTHER PUBLICATIONS

International Search Report and Written Opinion for International Application No. PCT/US2023/084888 mailed Apr. 22, 2024, 8 pages.

* cited by examiner

FULL DYNAMIC POST-PACKAGE REPAIR

FIELD

This disclosure relates generally to data processing systems, and more specifically to data processing systems with high reliability memory.

BACKGROUND

Modern dynamic random-access memory (DRAM) is used in most personal computer systems and servers today due to its low cost, high density, and random-access times. Because of their small size, DRAM memory cells are susceptible to soft errors. A soft error is a data error caused by the occurrence of a random electrical event, such as an alpha particle passing through the capacitor, electromagnetic interference, etc. Thus, a soft error does not reflect any fundamental error or defect in the circuitry. On the other hand, memory cells occasionally contain circuit defects that get worse over time until the memory cell or a set of adjacent memory cells fail, which is known as a "hard error". Conventionally DRAMs are tested at the factory to detect hard errors and are corrected by substituting redundant rows or columns for the failing rows or columns. However, detection and correction of memory cells that become defective after manufacturing is more difficult. The memory system is typically tested for hard errors at startup and the portion of memory that has a hard error is removed from the system memory map. However, if a hard error occurs after startup, running programs may crash, causing inconvenience or loss of data for the user.

In order to correct hard errors that arise after factory test, the Joint Electron Devices Engineering Council (JEDEC) adopted a feature known as post-package repair. Post-package repair was first adopted in the double data rate version four (DDR4) specification. Post-package repair enables an affected memory chip to replace a defective row with a replacement row. There are two types of post-package repair. "Soft" post-package repair uses the replacement row for the defective row while the chip is powered up, but the substitution is lost when the chip is powered down. "Hard" post-package repair permanently substitutes the replacement row for the defective row.

Before invoking the post-package repair sequence, the host processor has to migrate data from the failing row to other memory. The actual post-package repair operation requires all banks to be in the precharged state so that no operations are taking place. For double data rate, version 5 (DDR5) memory, entry into both hard and soft post-package repair is protected through a read-modify-write guard key to prevent unintentional post-package repair programming. A soft post-package repair sequence takes about one millisecond (ms), while a hard post-package repair operation takes about 200 ms due to re-programming of memory device fuses. After the end of the hard post-package repair sequence, the host processor must migrate the data back to the memory before it starts reading and writing to the memory. Because of the length of time for this operation and software intervention, it adds significant latency to pending memory accesses of running programs, which causes other system issues, such as forcing a server node to go offline.

Figure 1:
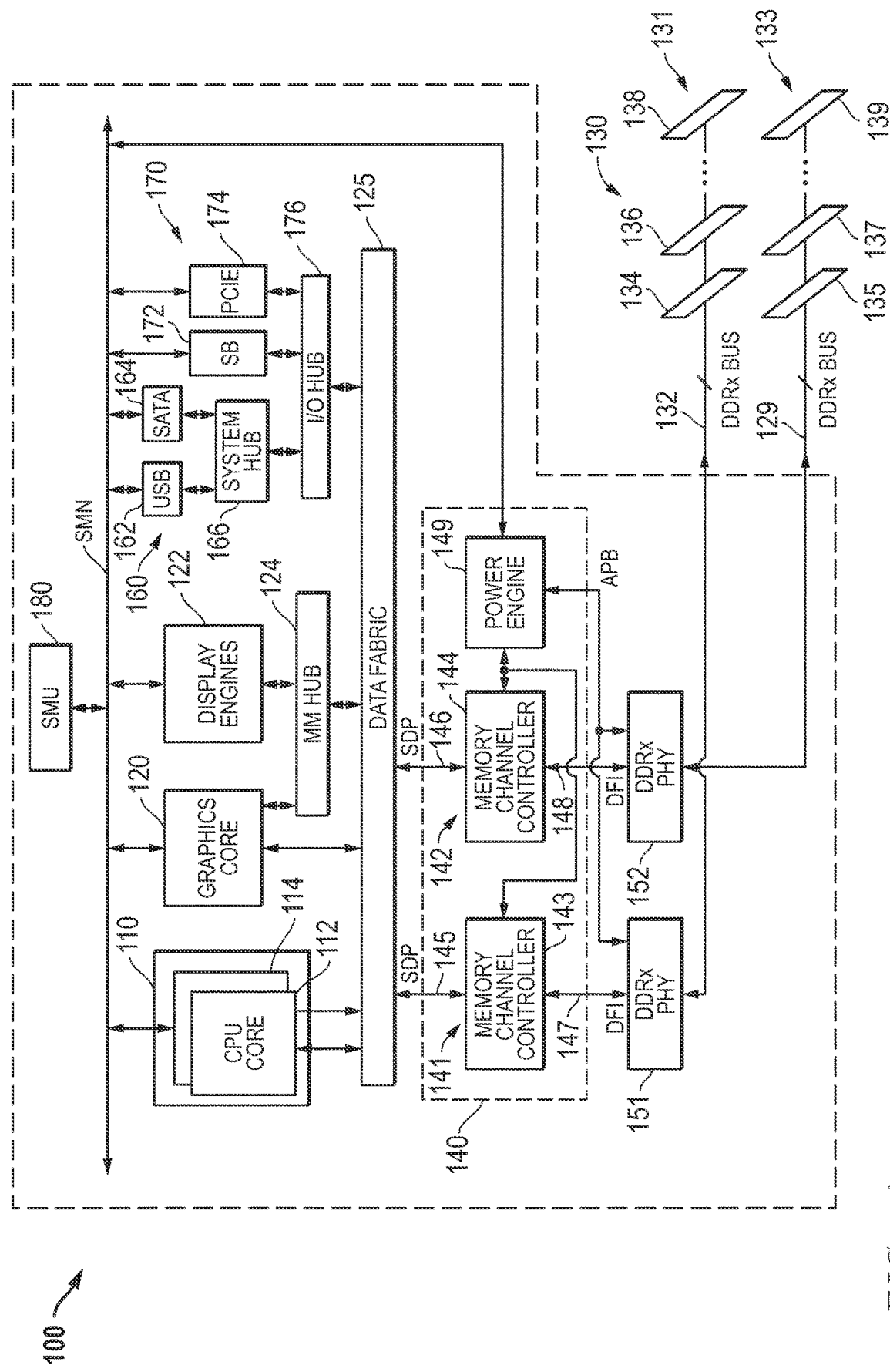
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue, an arbiter, and a controller. The controller is responsive to a repair signal for migrating data from a failing region of a memory to a buffer, generating at least one command to perform a post-package repair operation of the failing region, and migrating the data from the buffer to a substitute region of the memory. The controller migrates the data to and from the buffer by providing migration read requests and migration write requests, respectively, to the command queue. The arbiter uses the plurality of arbitration rules for both the read migration requests and the write migration requests, and the read access requests and the write access requests.

A data processing system includes memory accessing agents, a data fabric, a memory, and a memory controller. The memory controller receives read access requests and write access requests from the memory accessing agents through the data fabric. It selects from among the read access requests and the write access requests to send to the memory using a plurality of arbitration rules. In response to a repair signal, the memory controller migrates data from a failing region of the memory to a buffer, generates at least one command to perform a post-package repair operation of the failing region, and migrates the data from the buffer to a substitute region of the memory by providing migration read requests and migration write requests, respectively. The memory controller uses a plurality of arbitration rules for both the migration read requests and the migration write requests, and the read access requests and the write access requests.

A method includes selecting from among read access requests and write access requests in a command queue using a plurality of arbitration rules. Corresponding memory commands are provided in response to the selecting. Responsive to a repair signal, data is migrated from a failing region of a memory to a buffer, at least one command to perform a post-package repair operation of the failing region is generated, and the data from the buffer is migrated to a substitute region of the memory. Migrating the data to and from the buffer includes providing migration read requests and migration write requests, respectively, to the command queue. The plurality of arbitration rules is used for both the read migration requests and the write migration requests, and the read access requests and the write access requests FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high-performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally commonly connected to a memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus, for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and in the exemplary embodiment conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection to memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version five (DDR5), DDR version four (DDR4), low power DDR4 (LPDDR4), graphics DDR version five (GDDR5), and high bandwidth memory (HBM), and can be adapted for future memory technologies. These memories provide high bus bandwidth and high-speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, and in FIG. 1 includes DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
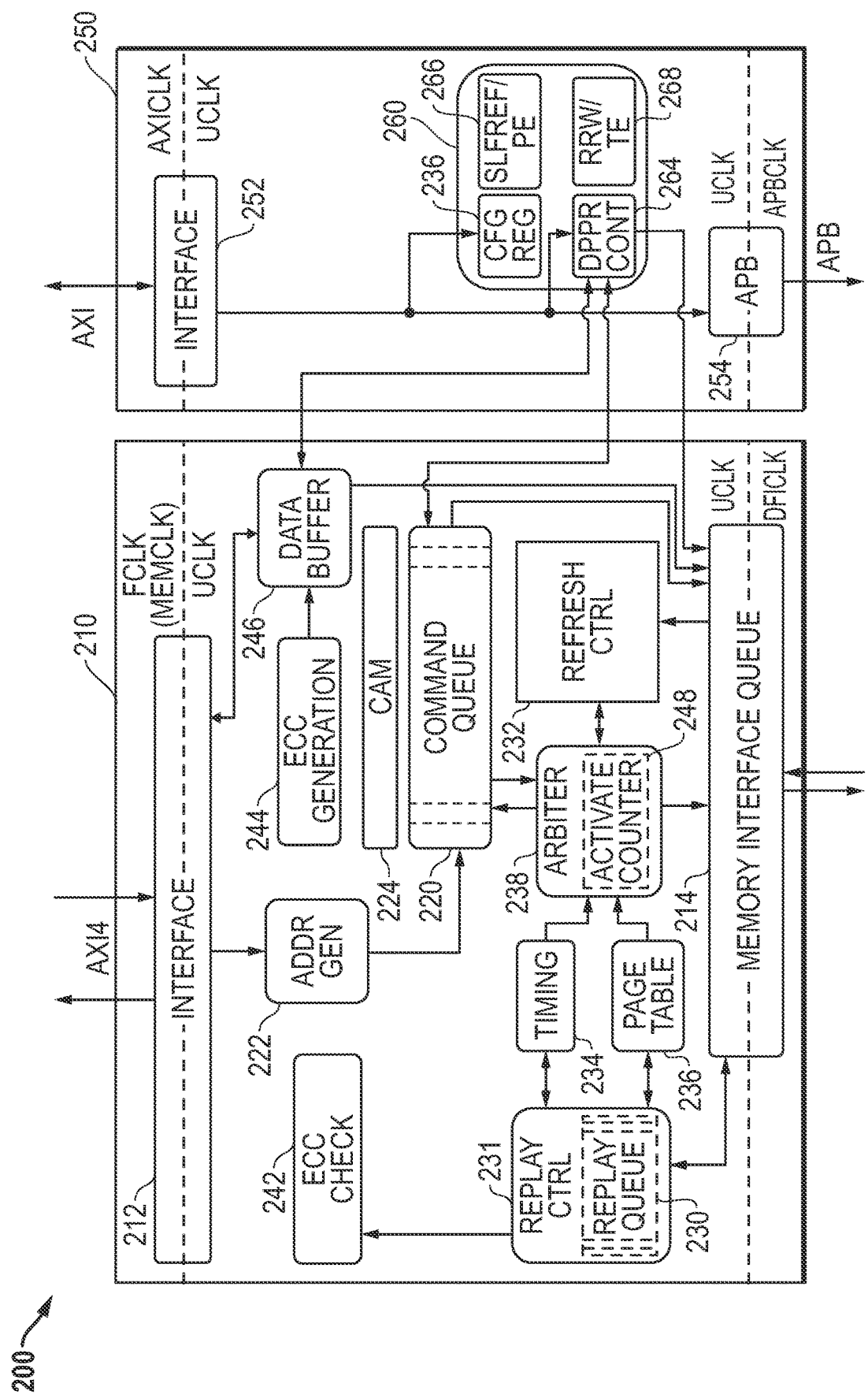
FIG. 2 illustrates in block diagram form a memory controller according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, refresh control logic 232, a timing block 234, a page table 236, an arbiter 238, an error correction code (ECC) check circuit 242, an ECC generation block 244, a data buffer 246, and refresh logic 247.

Interface 212 has a first bidirectional connection to data fabric 125 over an external bus, and an output. In memory controller 200, this external bus is compatible with an extensible interface labelled "AXI4". Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QOS) identifiers. CAM 224 includes information to enforce ordering rules, such as write after write (WAW) and read after write (RAW) ordering rules.

Error correction code (ECC) generation block 244 determines the ECC of write data to be sent to the memory. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh control logic 232 includes state machines for various power down, refresh, and termination resistance (ZQ) calibration cycles that are generated separately from normal read and write memory access requests received from memory accessing agents. For example, if a memory rank is in precharge power down, it must be periodically awakened to run refresh cycles. Refresh control logic 232 generates refresh commands periodically and in response to designated conditions to prevent data errors caused by leaking of charge off storage capacitors of memory cells in DRAM chips. Refresh control logic 232 includes an activate counter 248, which in this embodiment has a counter for each memory region which counts a rolling number of activate commands sent over the memory channel to a memory region. The memory regions are memory banks in some embodiments, and memory sub-banks in other embodiments as further discussed below. In addition, refresh control logic 232 periodically calibrates ZQ to prevent mismatch in on-die termination resistance due to thermal changes in the system.

Arbiter 238 is bidirectionally connected to command queue 220 and is the heart of memory channel controller 210, and improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "tRC". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface 254 labelled "AXI", and a power engine 260. Interface 252 has a bidirectional connection to the SMN, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a dynamic post-package repair circuit 264 labelled "DPPR CKT", a self-refresh controller 266 labelled "SELFRE/PE", and a reliable read/write timing engine 268 labelled "RRW/TE". Configuration registers 262 are programmed over the AXI bus, and store configuration information to control the operation of various blocks in memory controller 200. Accordingly, configuration registers 262 have outputs connected to these blocks that are not shown in detail in FIG. 2. Self-refresh controller 266 is an engine that allows the manual generation of refreshes in addition to the automatic generation of refreshes by refresh control logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QOS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page. Arbiter 238, in some embodiments, determines eligibility for command selection based on at least on respective values of activate counter 248 for target memory regions of the respective commands.

Dynamic Post-Package Repair

Figure 3:
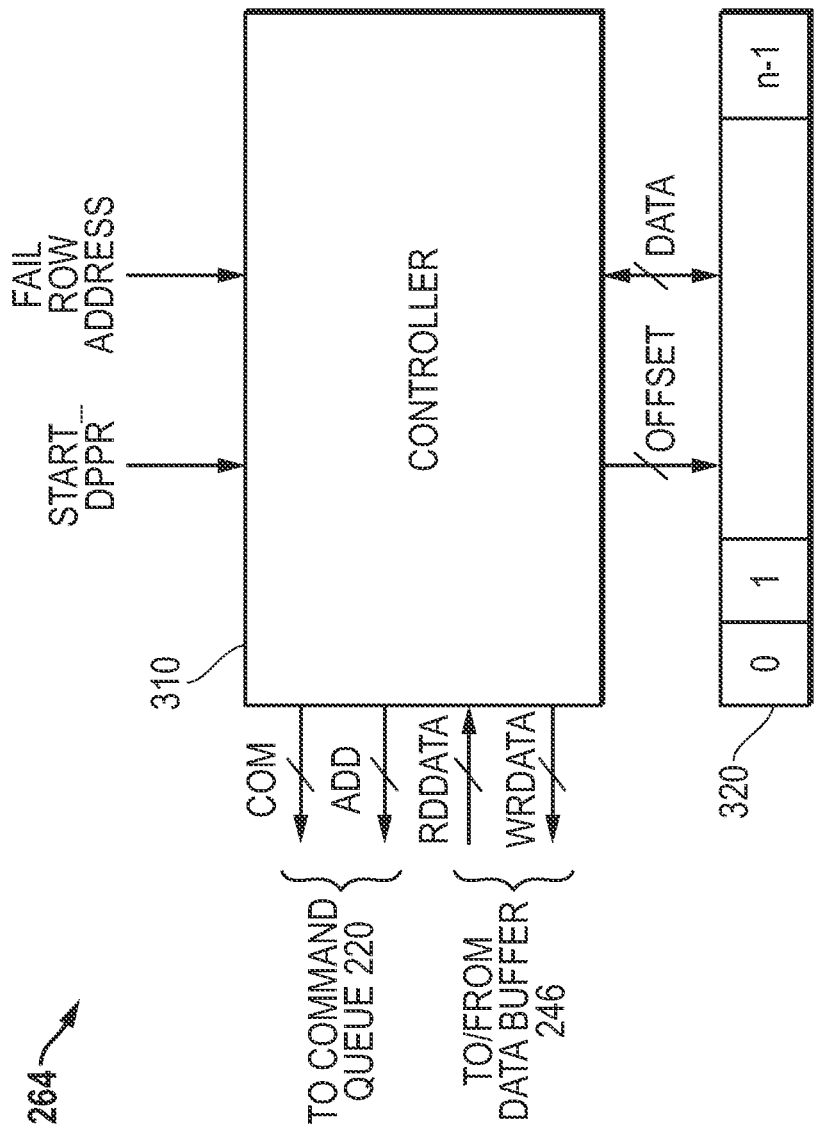
FIG. 3 illustrates in block diagram form the dynamic post-package repair circuit of FIG. 2 according to some embodiments.

FIG. 3 illustrates in block diagram form dynamic post-package repair circuit 264 of FIG. 2 according to some embodiments. Dynamic post-package repair circuit 264 includes a controller 310 and a buffer 320. Controller 310 has four ports, including a first port for receiving signals from the SMN bus or from a port of data fabric 125 (as shown in FIG. 1), a second port connected to command queue 220, a third port connected to data buffer 246, and a fourth port (described further below).

The first port includes inputs for receiving a first signal labelled "START_DPPR" and a second signal labelled "FAIL ROW ADDRESS". Controller 310 receives the START_DPRR signal and in response performs a post-package repair operation on a region of a memory, e.g., of row of a DRAM chip on DIMM 134 of FIG. 1 having a base address indicated by the FAIL ROW ADDRESS signal. In the example shown in FIG. 3, the region is a row of a DRAM chip on DIMM 134. In other embodiments, the region could be a column, a group of columns, a row, a group of rows, etc. In various embodiments, hardware circuitry in controller 310 or software running on controller 310 or some combination of the two can dynamically detect the need to perform post-package repair. For example, the need could arise from a memory scrubber detecting a high number of correctable errors, indicating that a memory cell on a particular row of the memory is about to fail, as described in U.S. Ser. No. 10/042,700. Another example would be that memory controller 200 has replayed a read access a sufficient number of times to determine that there is a real, uncorrectable error when accessing a certain row of the memory.

The second port conducts signals from controller 310 to command queue 220. The second port includes a command signal labelled "COM", and an address signal labelled "ADD". Controller 310 uses the COM and ADD signals to specify migration read commands and migration write commands, both of which will be described more fully below.

The third port conducts signals between controller 310 and data buffer 246. The third port includes an input for receiving read data received from data buffer 246 labelled "RDDATA", and an output for providing write data to data buffer 246 labelled "WRDATA", and. Controller 310 uses the RDDATA signal to receive migration data for storage in buffer 320 in response to a migration read command, and the WRDATA signals to transmit migration data for storage in the external DRAM with a migration write command. These operations will be described more fully below.

The fourth port conducts signals between controller 310 and buffer 320. The fourth port includes an output for providing an address signal labelled "OFFSET", and a bidirectional input/output for conducting a signal labelled "DATA". The OFFSET signal indicates the offset in buffer 320 of the data element being read from it or written to it. The DATA signal conducts the data being read from or written to buffer 320. Buffer 320 is large enough to store data from an entire row of the DRAM which is being migrated from a defective physical row to a substitute physical row mapped to the address of the defective physical row. In a concrete example, the DRAM is a by-eight (×8) DRAM that stores 1K of data (1024 bits) in a row, and buffer 320 is capable of storing all 1024 bits. It should be apparent that buffer 320 can vary in size to support different memory widths, burst lengths, etc. In other embodiments, only a single 64-bit buffer can be used to migrate data between the defective row and another unused row in the memory system, and then between the unused row and the substitute row mapped to the defective row when the post-package repair is complete. However, this operation requires twice as many memory access operations.

In general, dynamic post-package repair circuit 264 is responsive to a repair signal, e.g., START_DPPR, for migrating data from a failing row of memory to buffer 320, to generate at least one command as the COM signal to perform a post-package repair operation of the failing row, and to migrate the data of the failing row from buffer 320 to a substitute row of the memory mapped to the failing row.

According to various embodiments disclosed herein, controller 310 migrates the data to and from buffer 320 by providing migration read requests and migration write requests, respectively, to command queue 220. The mitigation read requests and the mitigation write requests resemble normal reads and writes, except dynamic post-package repair circuit 264 is the destination of the read data received from the external DRAM, and the source of the write data provided to the substitute row in the external DRAM. In this way, dynamic post-package repair circuit 264 offloads system software from the data migration task. In addition, memory controller 200 treats the migration reads and writes using the same priority rules discussed above that normal reads and writes do. This operation allows the reads and writes from the other memory accessing agents to have their reads and writes make progress toward completion while the post-package repair is being handled, and avoids a significant increase in latency.

Figure 4:
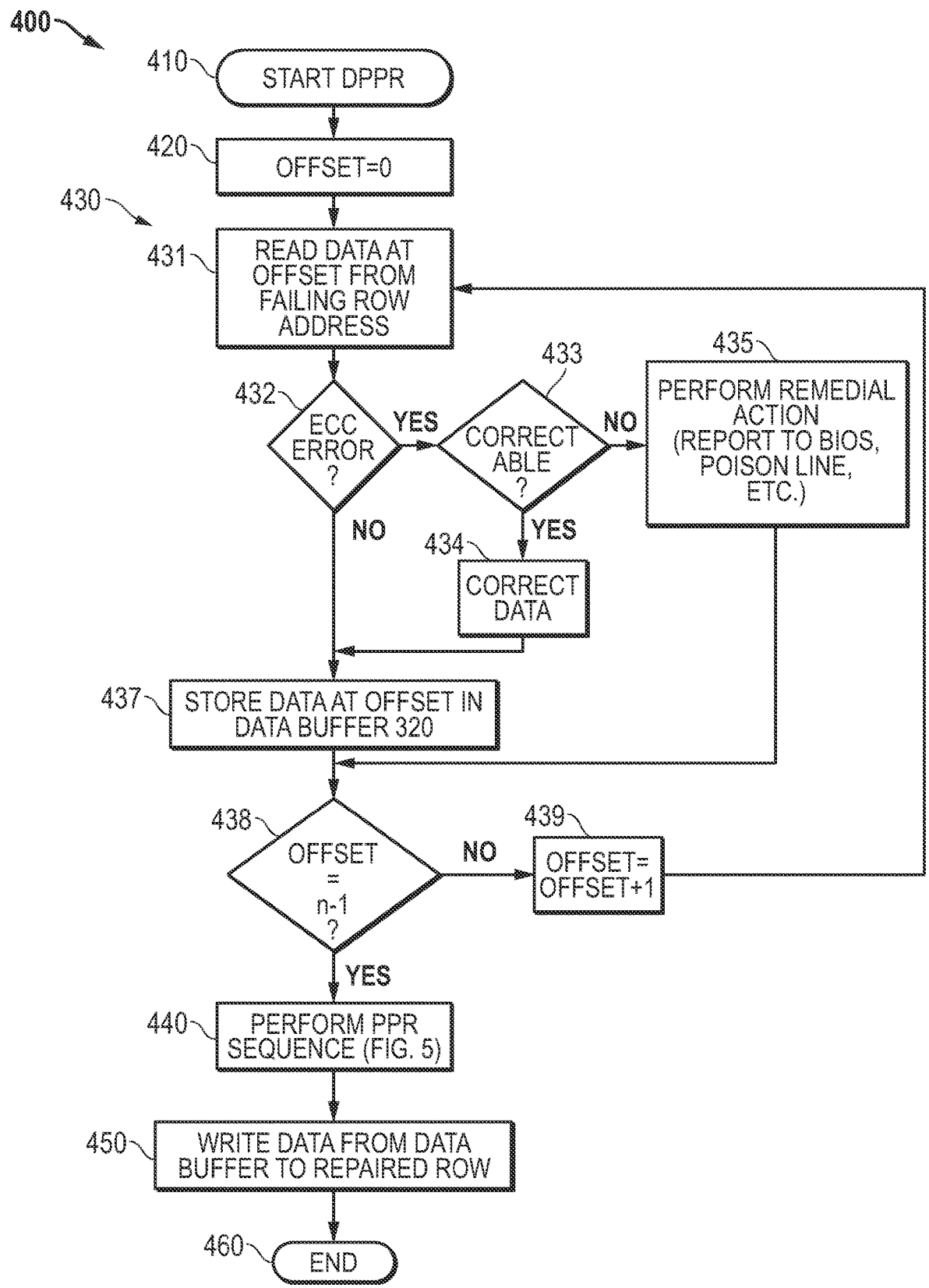
FIG. 4 illustrates a flow chart of operations performed by the dynamic post-package repair circuit of FIG. 2 according to some embodiments.

FIG. 4 illustrates a flow chart 400 of operations performed by dynamic post-package repair circuit 264 of FIG. 2 according to some embodiments. The process starts at box 410. For example, an external agent such as SMU 180 or a CPU core operating as a basic input-output system (BIOS) service processor could start the DPPR process by providing the START_DPPR signal. In another example, memory controller 200 itself could track ECC errors to regions, e.g., rows, and internally generate the START_DPPR signal. In one case, memory controller 200 could detect and track ECC errors during normal read and write operations. In another case, memory controller 200 could detect and track ECC errors during background scrubbing. In yet another case, memory controller 200 could use the automatic error check and scrub (ECS) feature of DDR5 memories to detect and track an unacceptably high number of ECC errors to a region during background scrubbing by polling its error registers, i.e., the number of correctable errors is above a threshold. In any case, a high number of ECC errors to a row may indicate that other memory cells along the row may also start to fail and cause the errors to become uncorrectable, allowing memory controller 200 to perform DPPR proactively.

In box 420, the OFFSET of the affected region is set to 0, and the flow proceeds to a sub-flow 430.

In sub-flow 430, data at the OFFSET from the FAIL ROW ADDRESS is read from the corresponding DRAM in an action box 431. A decision box 432 determines whether there is an ECC error in the read cycle. If there is an ECC error, then flow continues to a decision box 433, that determines whether the error is correctable, e.g., a single error in a single-error correction ECC system. If the error is correctable, then the data is corrected in an action box 434, and flow proceeds to an action box 437. If the data is not correctable, then flow proceeds to an action box 435. In action box 435, memory controller 200 takes one or more subsequent remedial actions. The subsequent remedial action may be, for example, reporting the error to BIOS, poisoning the row, a combination of the two, etc. To poison the row, memory controller 200 stores poison metadata into buffer 320, which will poison the line when the data is later written back to the row in the memory. The process then continues to a decision box 438. As shown in memory controller 200 of FIG. 2, boxes 432-435 are performed by ECC check circuit 242. In action box 437, the data is stored at the OFFSET from the base in buffer 320 and flow continues to decision box 438. In decision box 438, the OFFSET is compared to (n−1). If the offset is not equal to (n−1), then flow proceeds to an action box 439 which increments the OFFSET, i.e., OFFSET=OFFSET+1, and flow returns to action box 431. If the OFFSET is equal to (n−1), then flow proceeds to an action box 440.

An action box 440 performs the post-package repair sequence of FIG. 5, which will be described in more detail below.

In an action box 450, data is written one element at a time from buffer 320 to the substitute row, which has been mapped to the address of the fail row. The procedure ends in box 460.

Figure 5:
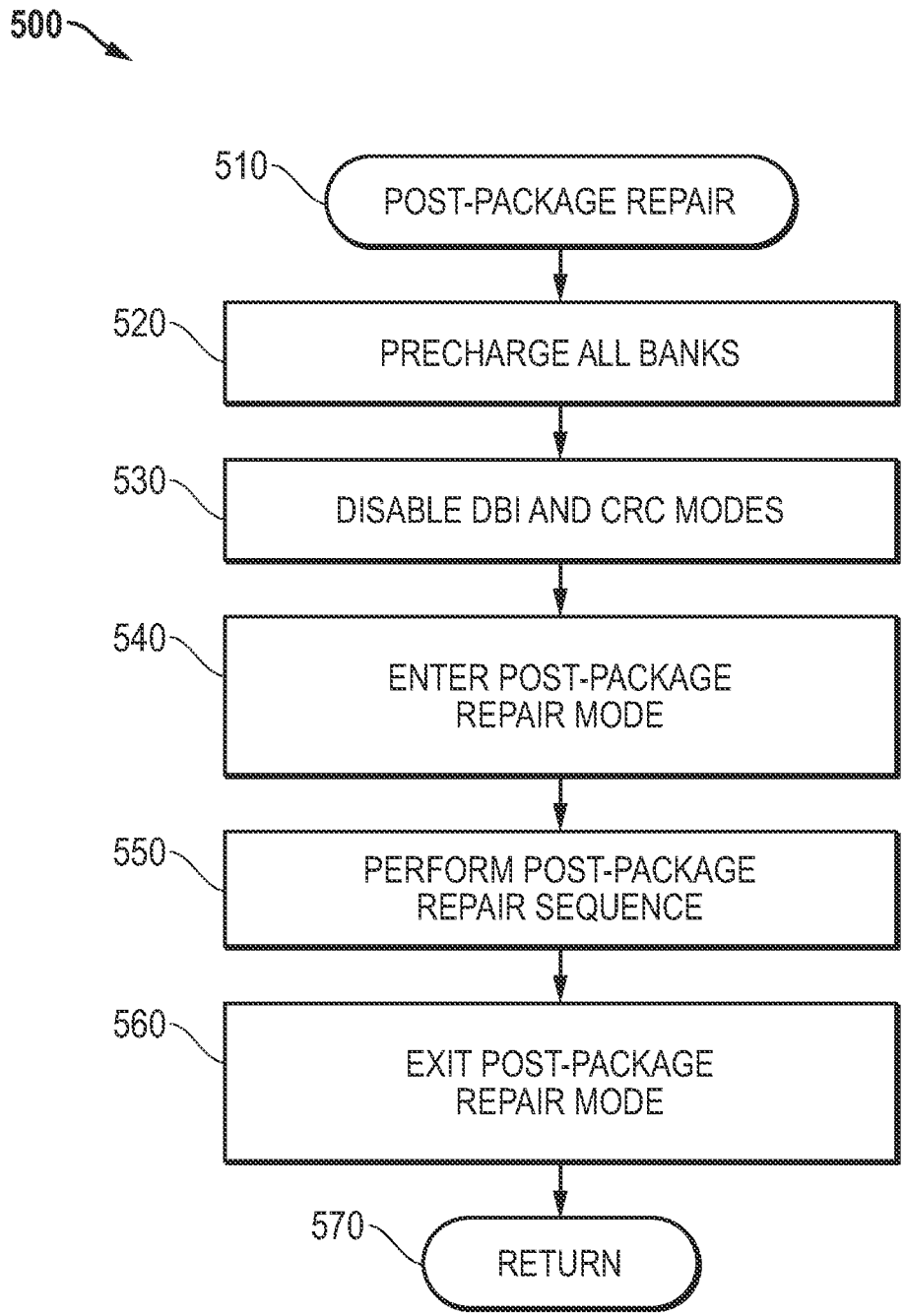
FIG. 5 illustrates a flow chart of a post-package repair routine according to some embodiments.

FIG. 5 illustrates a flow chart 500 of a post-package repair sub-flow according to some embodiments. Data processing system of FIG. 1 uses DDR5 DRAMs, but DDR5 is just an example, and corresponding flows according to the operation described herein may be used for different DRAMs that also support post-package repair. Flow starts in a box 510. In an action box 520, memory controller 200 precharges all banks of the affected memory chips, allowing their mode registers to be updated. In an action box 530, memory controller 200 disables the data bus inversion (DBI) and cyclic redundancy check (CRC) modes of the affected DRAMs by writing to certain mode register bits as defined by the relevant standard. In an action box 540, memory controller 200 causes the affected memory chips to enter the post-package repair mode by setting one or more mode register bits defined by the relevant standard. Note that between action boxes 530 and 540, some DRAMs require an extended unlock sequence before post-package repair can be enabled, to prevent a random software error from causing an inadvertent post-package repair operation. In an action box 550, the affected DRAM performs the post-package repair operation. In an action box 560, memory controller 200 causes the affected memory chips to exit the post-package repair mode by clearing the relevant mode register bit or bits. In an action box 570, flow returns to the main flow shown in flow chart 400 and in particular to action box 450.

Thus, a system of dynamic post-package repair by a memory controller has been described. In this system, the memory controller, and specifically a dynamic post-package repair circuit, migrates the data of the failing row to a buffer 320. It does so by using mitigation read (for storing data in a buffer such as an on-chip buffer) and write (for rewriting the data to the substitute row that has been mapped to the address of the fail row) commands provided to a command queue for arbitration using the same arbitration rules as for normal read and write requests. Thus, the memory controller performs the post-package repair operation in hardware, and does so without sacrificing efficiency or significantly increasing latency by allowing the arbiter to schedule the migration read and write requests along with normal read and write requests.

Data processing system 600 of FIG. 6 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, various versions of DDR memory that support post-package repair, such as DDR4, DDR5, and LPDDR4, may be used. The buffer that is used to temporarily store the data to be migrated can either be located on-chip in the memory controller, or in another unused row in system memory. The actual post-package repair command sequence will vary between DRAM versions and between manufacturers and may include special unlock cycles due to the permanence of the post-package repair operation. In the illustrated embodiment, the unit of repair is a row, but in other embodiments the unit can be a different size. The number of rows available for repair will vary between manufacturers and may be, for example, on row for each bank group. The specific arbitration rules in common between the normal read and write requests and the migration read and write requests will vary between embodiments will vary between memory controller designs. In some embodiments, the arbitration rules in common between the normal read and write requests and the migration read and write requests will be fewer than the whole set of arbitration rules used with either type of requests. In various embodiments, a memory controller that interfaces to a memory supporting full dynamic post-package repair can implement only soft post-package repair, only hard post-package repair, or both. Moreover, while the exemplary embodiment was disclosed in the context of an APU, the technique is also useful for memory controllers used in servers and other high-end computing products.

Accordingly, it is intended by the appended claims to cover all modifications of the disclosed embodiments that fall within the scope of the disclosed embodiments.

What is claimed is:

1. A memory controller comprising:
    a command queue;
    an arbiter coupled to said command queue;
    a buffer; and
    a post-package repair (PPR) controller responsive to a repair signal for migrating data from a failing region of a memory to a buffer, generating at least one command to perform a post-package repair operation of the failing region, and migrating the data from the buffer to a substitute region of the memory,
    wherein the PPR controller provides migration read and write access requests to the command queue, and the arbiter uses the same arbitration rules for both the migration read and write access requests and normal read and write access requests.

2. The memory controller of claim 1, wherein the failing region comprises a first row and the substitute region comprises a second row mapped to an address of the first row.

3. The memory controller of claim 1, wherein the command queue receives the normal read and write access requests from a plurality of memory accessing agents.

4. The memory controller of claim 1, wherein the memory controller poisons the failing region if one of the migration read access requests generates an uncorrectable error.

5. The memory controller of claim 1, wherein the memory controller generates the repair signal in response to detecting a number of correctable errors above a threshold during normal read and write operations.

6. The memory controller of claim 1, wherein the memory controller generates the repair signal in response to polling a memory adapted to detect a number of correctable errors above a threshold during read and write operations.

7. The memory controller of claim 1, wherein the memory controller corrects an error in the data by storing corrected data in the buffer if one of the migration read requests generates a correctable error.

8. A data processing system, comprising:
    memory accessing agents;
    a data fabric;
    a memory; and
    a memory controller for receiving read access requests and write access requests from the memory accessing agents through the data fabric, and selecting from among the read access requests and the write access requests to send to the memory using a plurality of arbitration rules, wherein in response to a repair signal, the memory controller migrates data from a failing region of the memory to a buffer of the memory controller, generates at least one command to perform a post package repair operation of the failing region, and migrates the data from the buffer to a substitute region of the memory by providing migration read requests and migration write requests, respectively, wherein the memory controller uses the plurality of arbitration rules for both the migration read requests and the migration write requests, and the read access requests and the write access requests.

9. The data processing system of claim 8, wherein the memory controller comprises:
    a command queue;
    an arbiter for selecting from among the read access requests and the write access requests in the command queue to provide corresponding memory commands using the plurality of arbitration rules; and
    a post-package repair (PPR) controller responsive to the repair signal for migrating the data from the failing region of the memory to the buffer, for generating the at least one command to cause the memory to perform the post package repair operation of the failing region, and migrating the data from the buffer to the substitute region of the memory,
    wherein the PPR controller migrates the data to and from the buffer by providing the migration read requests and the migration write requests, respectively, to the command queue, and the arbiter uses the plurality of arbitration rules for both the migration read requests and the migration write requests, and the read access requests and the write access requests.

10. The data processing system of claim 9, wherein the command queue receives the read access requests and the write access requests from a plurality of memory accessing agents.

11. The data processing system of claim 9, wherein the command queue, the arbiter, the controller, and the buffer are combined on a single semiconductor chip.

12. The data processing system of claim 9, wherein the memory controller provides an error signal to a basic input-output system (BIOS) if one of the migration read requests generates an uncorrectable error.

13. The data processing system of claim 9, wherein the memory controller corrects an error in the data by storing corrected data in the buffer if one of the migration read requests generates a correctable error.

14. The data processing system of claim 13, wherein the data fabric comprises a background scrubber for activating the repair signal in response to detecting a detecting a number of correctable errors above a threshold in the failing region.

15. The data processing system of claim 8, wherein the failing region comprises a first row and the substitute region comprises a second row mapped to an address of the first row.

16. A method for a memory controller to perform post-package repair (PPR), comprising:
    selecting from among read access requests and write access requests in a command queue using a plurality of arbitration rules;
    providing corresponding memory commands in response to the selecting; and
    responsive to a repair signal:
        migrating data from a failing region of a memory to a buffer of the memory controller;
        generating at least one command to perform a post-package repair operation of the failing region; and
        migrating the data from the buffer to a substitute region of the memory, wherein migrating the data to and from the buffer comprises providing migration read requests and migration write requests, respectively, to the command queue, and using the plurality of arbitration rules for both the migration read requests and the migration write requests, and the read access requests and the write access requests.

17. The method of claim 16, wherein the failing region comprises a first row and the substitute region comprises a second row mapped to an address of the first row.

18. The method of claim 16, further comprising:

receiving the read access requests and the write access requests from a plurality of memory accessing agents.

19. The method of claim 16, further comprising:

providing an error signal to a basic input-output system (BIOS) if one of the migration read requests generates an uncorrectable error.

20. The method of claim 16, further comprising:

correcting an error in the data, the correcting comprising storing corrected data in the buffer if one of the migration read requests generates a correctable error.

* * * * *